(12) United States Patent
Okamoto et al.

(10) Patent No.: US 10,079,268 B2
(45) Date of Patent: Sep. 18, 2018

(54) MEMORY DEVICE

(71) Applicant: TOSHIBA MEMORY CORPORATION, Tokyo (JP)

(72) Inventors: Hiroki Okamoto, Hyogo (JP); Hiroyuki Kutsukake, Mie (JP); Akira Hokazono, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/700,613

(22) Filed: Sep. 11, 2017

(65) Prior Publication Data

US 2018/0083068 A1 Mar. 22, 2018

Related U.S. Application Data

(60) Provisional application No. 62/395,663, filed on Sep. 16, 2016.

(51) Int. Cl.
*G11C 5/06* (2006.01)
*H01L 27/24* (2006.01)
(Continued)

(52) U.S. Cl.
CPC ........ *H01L 27/249* (2013.01); *G11C 13/0028* (2013.01); *H01L 27/2454* (2013.01); *H01L 45/1226* (2013.01); *G11C 13/0007* (2013.01); *G11C 2213/32* (2013.01); *G11C 2213/71* (2013.01); *G11C 2213/79* (2013.01); *H01L 21/02271* (2013.01); *H01L 21/28158* (2013.01); *H01L 21/32136* (2013.01); *H01L 29/66742* (2013.01); *H01L 29/78642* (2013.01); *H01L 45/08* (2013.01); *H01L 45/146* (2013.01); *H01L 45/1608* (2013.01)

(58) Field of Classification Search
CPC ............... H01L 27/249; H01L 27/2454; H01L 27/1226; G11C 13/0028
USPC ...................................... 365/63, 53
See application file for complete search history.

(56) References Cited

U.S. PATENT DOCUMENTS 8,891,280 B2 * 11/2014 Castro ................. G11C 5/06
365/163
2008/0315296 A1 12/2008 Tanaka et al.
(Continued)

FOREIGN PATENT DOCUMENTS

JP 2009-004517 A 1/2009
JP 5481564 B2 4/2014
JP 2016-021594 A 2/2016

*Primary Examiner* — Vu Le
(74) *Attorney, Agent, or Firm* — Foley & Lardner LLP

(57) ABSTRACT

A memory device includes a first interconnect extending in a first direction, a first and a second semiconductor members extending in a second direction, a first and a second gate lines extending in a third direction, a second and a third interconnects extending in the second direction. The first and the second semiconductor members are arranged along the first direction, with first ends in the second direction connected to the first interconnect. The second interconnect is connected to a second end in the second direction of the first semiconductor member. The third interconnect is connected to a second end in the second direction of the second semiconductor member. The distance between the first interconnect and the first gate line is longer than the distance between the first interconnect and the second gate line.

14 Claims, 11 Drawing Sheets

(51) Int. Cl.
*H01L 45/00* (2006.01)
*G11C 13/00* (2006.01)
H01L 29/786 (2006.01)
H01L 29/66 (2006.01)
H01L 21/02 (2006.01)
H01L 21/3213 (2006.01)
H01L 21/28 (2006.01)

(56) References Cited

U.S. PATENT DOCUMENTS

2013/0234101 A1 12/2013 Sasago et al.
2015/0295011 A1* 10/2015 Zhang ................ H01L 27/2436
257/5

* cited by examiner

MEMORY DEVICE

CROSS-REFERENCE TO RELATED APPLICATIONS

This application is based upon and claims the benefit of priority from U.S. Provisional Patent Application 62/395,663, filed on Sep. 16, 2016; the entire contents of which are incorporated herein by reference.

FIELD

Embodiments relate to a memory device.

BACKGROUND

In recent years, there has been proposed a memory device in which resistance change memory cells are integrated in three dimensions. In such a memory device, a resistance change film is provided between a word line and a bit line. Data are stored by controlling the resistance value of this resistance change film. Further improvement of memory density is desired also in such a three-dimensional memory device.

DETAILED DESCRIPTION

A memory device according to an embodiment includes a first interconnect extending in a first direction, a first semiconductor member and a second semiconductor member extending in a second direction, a first gate line and a second gate line extending in a third direction, a second interconnect and a third interconnect extending in the second direction, a fourth interconnect, and a first resistance change film connected between the second interconnect and the fourth interconnect. The second direction crosses the first direction. The third direction crosses a plane including the first direction and the second direction. The first semiconductor member and the second semiconductor member are arranged along the first direction, with first ends in the second direction connected to the first interconnect. The second interconnect is connected to a second end in the second direction of the first semiconductor member. The third interconnect is connected to a second end in the second direction of the second semiconductor member. The distance between the first semiconductor member and the first gate line is shorter than the distance between the first semiconductor member and the second gate line. The distance between the second semiconductor member and the second gate line is shorter than the distance between the second semiconductor member and the first gate line. The distance between the first interconnect and the first gate line is longer than the distance between the first interconnect and the second gate line. No conductive member or semiconductor member is interposed on a straight line extending in the second direction and connecting between an edge on the first semiconductor member side of the first gate line and the first interconnect.

Embodiments of the invention will now be described with reference to the drawings.

Figure 1:
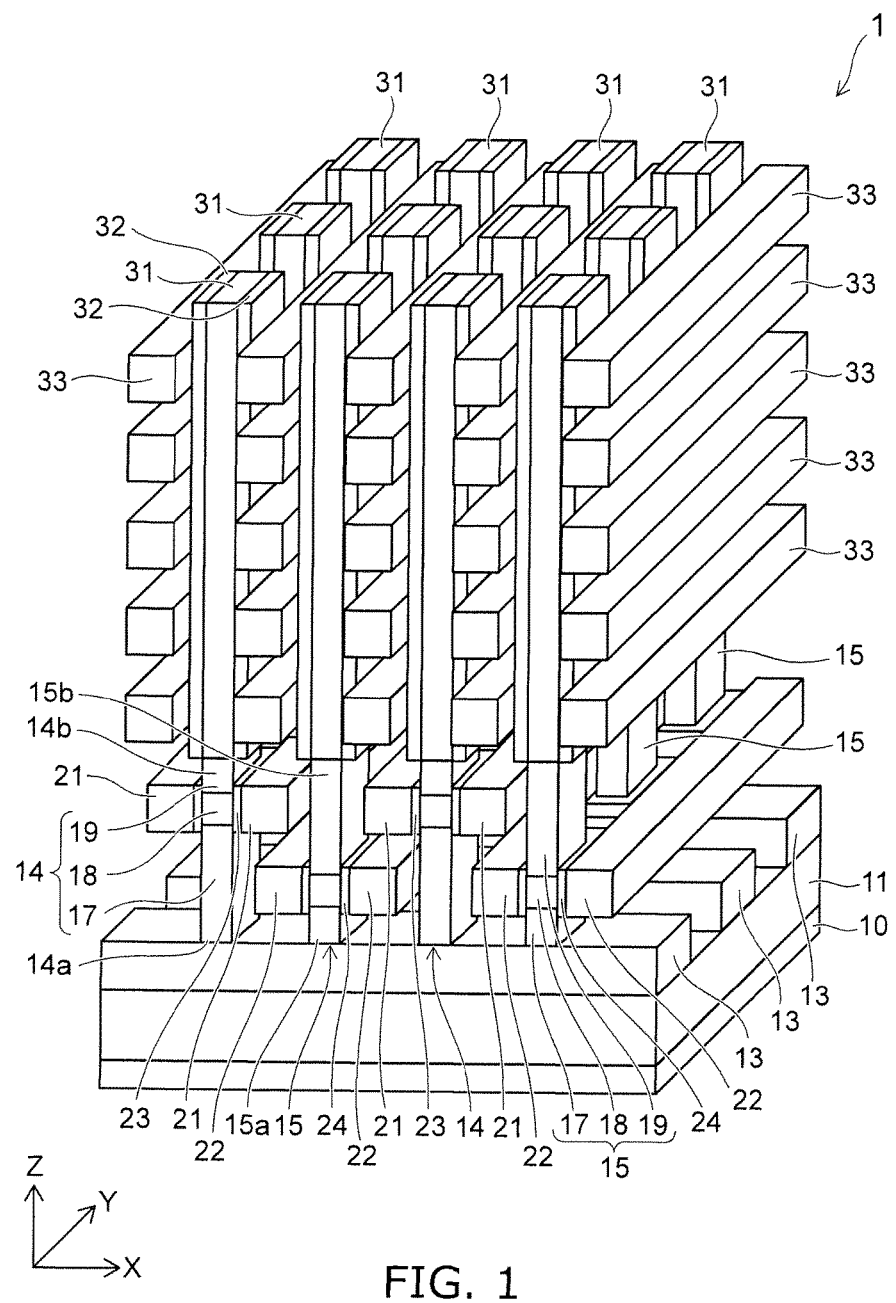
FIG. 1 is a perspective view showing a memory device according to an embodiment.

FIG. 1 is a perspective view showing a memory device according to the embodiment.

Figure 2:
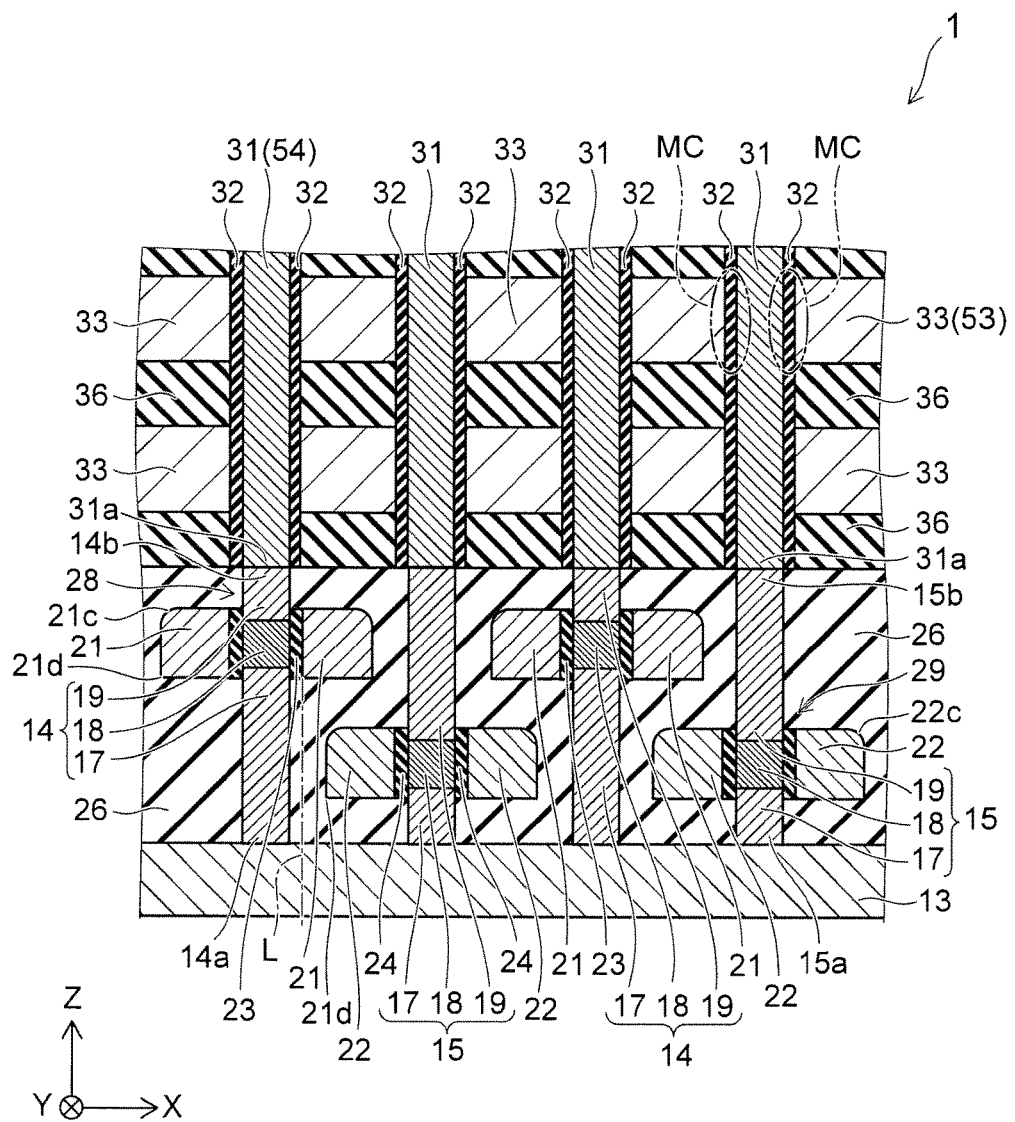
FIGS. 2 and 3 are sectional views showing the memory device according to the embodiment.
Figure 3:
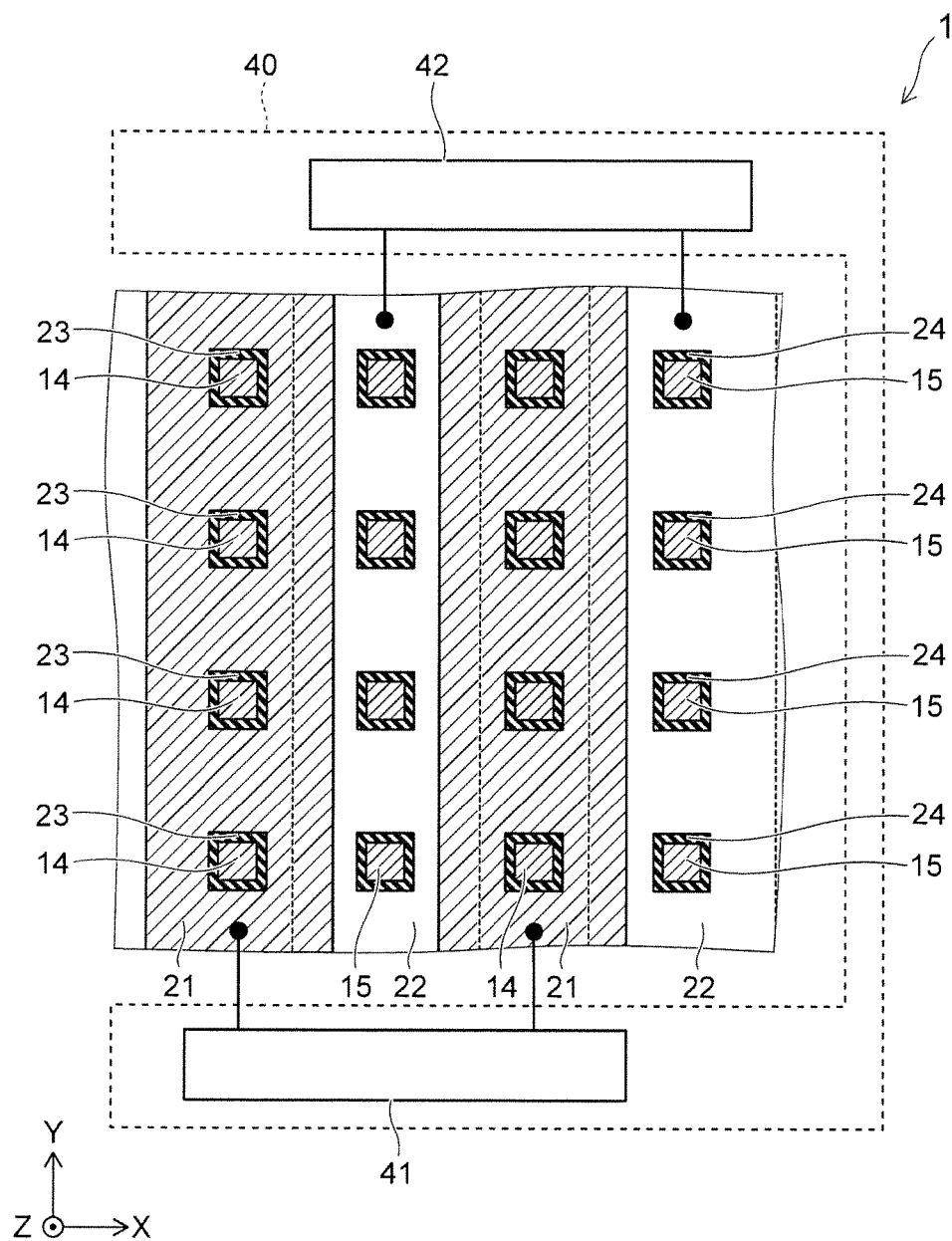

FIGS. 2 and 3 are sectional views showing the memory device according to the embodiment.

The drawings are schematic and emphasized as appropriate. For instance, the depicted components are fewer and larger than in reality. The figures are not necessarily consistent in e.g. the number and size ratio of components.

As shown in FIGS. 1 to 3, the memory device 1 according to the embodiment includes a silicon substrate 10. An interlayer insulating film 11 is provided on the silicon substrate 10. A control circuit 40 including such elements as CMOS transistors is formed in an upper portion of the silicon substrate 10 and in the interlayer insulating film 11. A plurality of global bit lines 13 are provided in parallel with each other on the interlayer insulating film 11.

In the following, an XYZ orthogonal coordinate system is adopted in this specification. The extending direction of the global bit lines 13 is referred to as "X-direction". The arranging direction of the global bit lines 13 is referred to as "Y-direction". The direction orthogonal to the X-direction and the Y-direction is referred to as "Z-direction". The X-direction and the Y-direction are parallel to the upper surface of the silicon substrate 10. The Z-direction is perpendicular to the upper surface of the silicon substrate 10. In the Z-direction, the direction from the silicon substrate 10 toward the interlayer insulating film 11 is also referred to as "upper", and the opposite direction is also referred to as "lower". However, these expressions are used for convenience, and irrelevant to the direction of gravity.

In this specification, the "silicon substrate" refers to a substrate composed primarily of silicon (Si). The same also applies to the other components. That is, the component with the designation including a material name is composed primarily of that material. Furthermore, silicon is generally a semiconductor material. Thus, unless otherwise specified, the silicon substrate is a semiconductor substrate. The same also applies to the other components. That is, in principle, the characteristics of the component reflect the characteristics of its main ingredient.

A respective plurality of silicon members 14 and 15 are provided on each global bit line 13. As viewed in the Z-direction, the silicon members 14 and 15 are arranged in a matrix along the X-direction and the Y-direction. In the matrix including the silicon members, a row extending in the X-direction includes the silicon members 14 and the silicon members 15 arranged alternately. A row extending in the Y-direction includes only the silicon members 14 or only the silicon members 15.

The silicon members 14 and 15 are shaped like a quadrangular pillar, a circular pillar, or an intermediate form therebetween with an axial direction in the Z-direction. FIGS. 1 to 3 show an example in which the silicon members are shaped like a quadrangular pillar. However, FIGS. 4 to 10 described later show an example shaped like a circular pillar. The lower ends 14a of the silicon members 14 and the lower ends 15a of the silicon members 15 arranged in a row along the X-direction are commonly connected to one global bit line 13. The silicon members 14 and 15 include an n$^+$-type portion 17, a p$^-$-type portion 18, and an n$^+$-type portion 19 arranged in this order from the lower side toward the upper side. The n$^+$-type portion 17 includes the lower end of the silicon member. The n$^+$-type portion 19 includes the upper end of the silicon member. The relationship between the n-type and the p-type may be reversed. The p$^-$-type portion 18 may be replaced by an i-type portion.

However, the silicon member 14 and the silicon member 15 are different in the position in the Z-direction of the p$^-$-type portion 18. The p$^-$-type portion 18 of the silicon member 14 is placed on the upper side of the p$^-$-type portion 18 of the silicon member 15. That is, the distance between the p$^-$-type portion 18 of the silicon member 14 and the global bit line 13 is longer than the distance between the p$^-$-type portion 18 of the silicon member 15 and the global bit line 13.

A respective plurality of gate lines 21 and 22 are provided on the global bit line 13. The gate lines 21 and 22 extend in the Y-direction and are arranged alternately along the X-direction. The gate line 21 is placed on the upper side of the gate line 22. That is, the distance between the global bit line 13 and the gate line 21 is longer than the distance between the global bit line 13 and the gate line 22. As viewed in the Z-direction, the side part of the gate line 21 and the side part of the gate line 22 overlap each other.

The gate line 21 is placed near the p$^-$-type portion 18 of the silicon member 14. The gate line 22 is placed near the p$^-$-type portion 18 of the silicon member 15. That is, the distance between the silicon member 14 and the gate line 21 is shorter than the distance between the silicon member 14 and the gate line 22. The distance between the silicon member 15 and the gate line 22 is shorter than the distance between the silicon member 15 and the gate line 21.

For instance, a plurality of silicon members 14 arranged in a row along the Y-direction penetrate through one gate line 21 in their p$^-$-type portions 18. In other words, the gate line 21 surrounds the p$^-$-type portions 18 of the silicon members 14 arranged in a row along the Y-direction. Furthermore, a plurality of silicon members 15 arranged in a row along the Y-direction penetrate through one gate line 22 in their p$^-$-type portions 18. In other words, the gate line 22 surrounds the p$^-$-type portions 18 of the silicon members 15 arranged in a row along the Y-direction.

The corner part 21c between the upper surface and the side surface of the gate line 21 has a smaller curvature and is rounder than the corner part 21d between the lower surface and the side surface. The corner part 22c between the upper surface and the side surface of the gate line 22 has a smaller curvature and is rounder than the corner part 22d between the lower surface and the side surface.

A gate insulating film 23 made of e.g. silicon oxide (SiO) is provided between the silicon member 14 and the gate line 21. A gate insulating film 24 made of e.g. silicon oxide is provided between the silicon member 15 and the gate line 22. An interconnect-to-interconnect insulating film 26 made of e.g. silicon oxide is provided so as to bury the silicon members 14 and 15, the gate lines 21 and 22, and the gate insulating films 23 and 24.

The density of the gate insulating films 23 and 24 is higher than the density of the interconnect-to-interconnect insulating film 26. The gate insulating films 23 and 24 are formed by e.g. the LP-CVD (low pressure chemical vapor deposition) method. The interconnect-to-interconnect insulating film 26 is formed by e.g. the CVD method using TEOS (tetraethyl orthosilicate) as a raw material.

Thus, only the interconnect-to-interconnect insulating film 26 is placed between the silicon member 14 and the gate line 22 adjacent to each other and between the silicon member 15 and the gate line 21 adjacent to each other. No conductive member or semiconductor member is placed therebetween. Furthermore, only the interconnect-to-interconnect insulating film 26 is interposed on a virtual straight line L extending in the Z-direction and connecting the edge on the silicon member 14 side of the gate line 21 and the global bit line 13. The same also applies to a virtual straight line (not shown) connecting the edge on the silicon member 15 side of the gate line 22 and the global bit line 13.

The silicon member 14 including the n$^+$-type portion 17, the p$^-$-type portion 18, and the n$^+$-type portion 19, the gate insulating film 23, and the gate line 21 constitute an n-channel TFT 28. Likewise, the silicon member 15, the gate insulating film 24, and the gate line 22 constitute an n-channel TFT 29. The TFTs 28 and 29 are switching elements for switching between conduction and interruption of current.

A local bit line 31 is provided on each of the silicon member 14 and the silicon member 15. The local bit line 31 extends in the Z-direction. The local bit line 31 is shaped like a quadrangular pillar, a circular pillar, or an intermediate form therebetween with an axial direction in the Z-direction. That is, the length in the Z-direction of the local bit line 31 is longer than the length in the X-direction and the length in the Y-direction. FIGS. 1 to 3 show an example in which the local bit line 31 is shaped like a quadrangular pillar.

The lower end 31a of the local bit line 31 is connected to the upper end 14b of the silicon member 14 or the upper end 15b of the silicon member 15. Each local bit line 31 is placed directly above the corresponding silicon member. Thus, in the memory device 1 as a whole, a plurality of local bit lines 31 are arranged in a matrix along the X-direction and the Y-direction.

A resistance change film 32 is provided on both side surfaces facing the X-direction of the local bit line 31. The resistance change film 32 is a film in which the resistance state is changed by the voltage or current applied thereto. The resistance change film 32 is made of e.g. metal oxide such as hafnium oxide (HfO$_2$). The resistance change film 32 may be a CBRAM (conductive bridging random access memory) film or PCRAM (phase change random access memory) film.

A plurality of word lines 33 extending in the Y-direction are provided between the local bit lines 31 adjacent in the X-direction, and spaced from each other in the Z-direction. As viewed in the Y-direction, the word lines 33 are arranged in a matrix along the X-direction and the Z-direction. The resistance change film 32 is connected between the local bit line 31 and the word line 33. Thus, a memory cell MC is constituted via the resistance change film 32 for each crossing portion of the local bit line 31 and the word line 33. The memory cells MC are arranged in a three-dimensional matrix along the X-direction, the Y-direction, and the Z-direction. An interlayer insulating film 36 made of e.g. silicon oxide is provided among the local bit lines 31, the resistance change films 32, and the word lines 33.

In the memory device 1, the control circuit 40 includes a potential generation circuit 41 for applying a potential to the gate line 21 and a potential generation circuit 42 for applying a potential to the gate line 22. Thus, the control circuit 40 can apply mutually different potentials to the gate line 21 and the gate line 22.

Next, a method for manufacturing the memory device according to the embodiment is described, focusing on a method for forming the silicon member and the gate line.

FIGS. 4A to 10B show a method for manufacturing the memory device according to the embodiment.

Figure 4A:
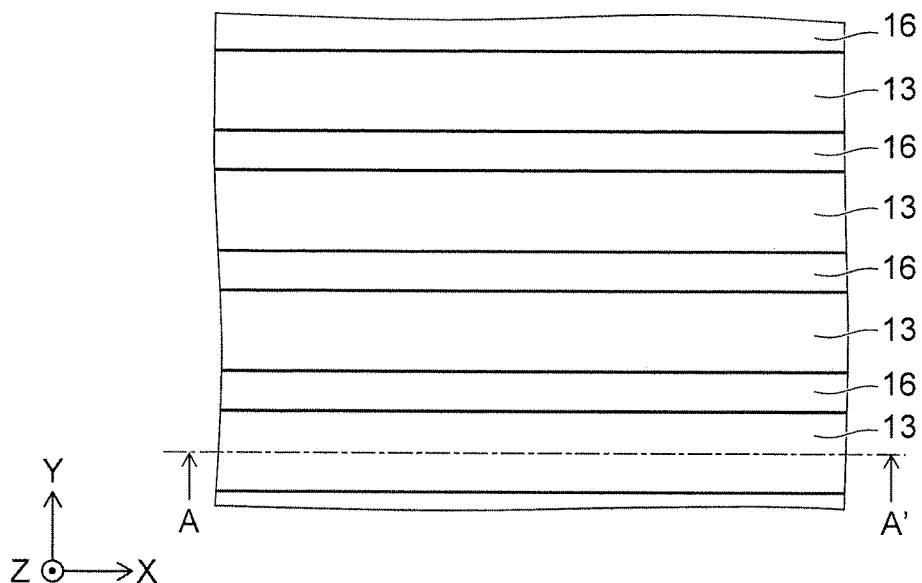
FIGS. 4A to 10B show a method for manufacturing the memory device according to the embodiment.
Figure 4B:
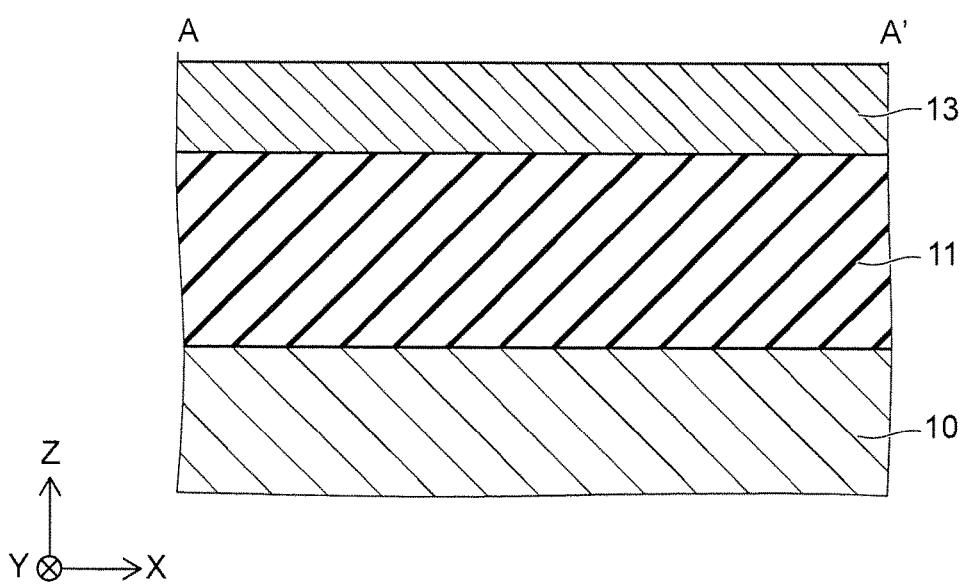

FIGS. 4A and 4B show the same step, where FIG. 4A is a plan view, and FIG. 4B is a sectional view taken along line A-A' shown in FIG. 4A. The same also applies to FIGS. 5A to 10B.

First, as shown in FIGS. 4A and 4B, an interlayer insulating film 11 is formed on a silicon substrate 10. At this time, a control circuit 40 including a potential generation circuit 41 and a potential generation circuit 42 is formed in an upper portion of the silicon substrate 10 and in the interlayer insulating film 11. Next, e.g. polysilicon is deposited on the silicon substrate 10 and patterned in a line-and-space configuration to form a plurality of global bit lines 13. The global bit lines 13 extend in the X-direction and are arranged in the Y-direction. Next, silicon oxide is buried between the global bit lines 13 to form an interconnect-to-interconnect insulating film 16.

Figure 5A:
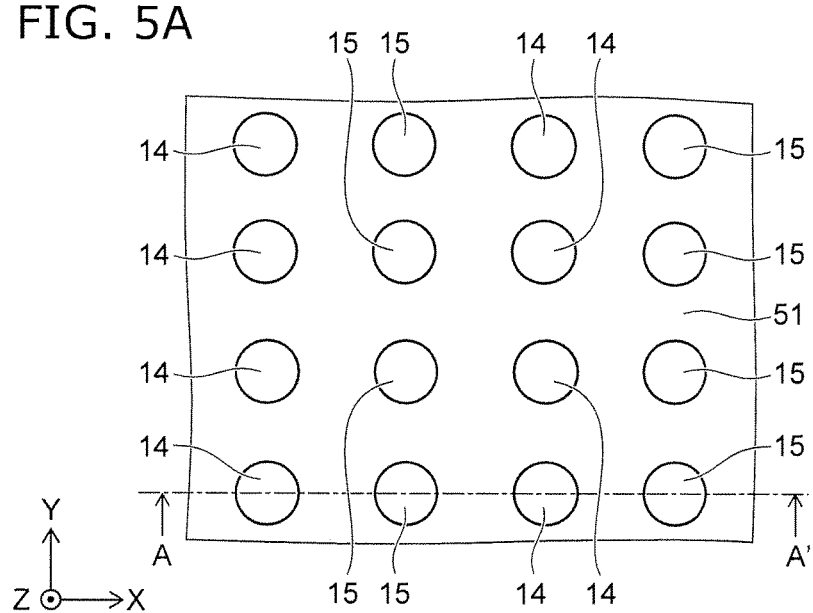
Figure 5B:
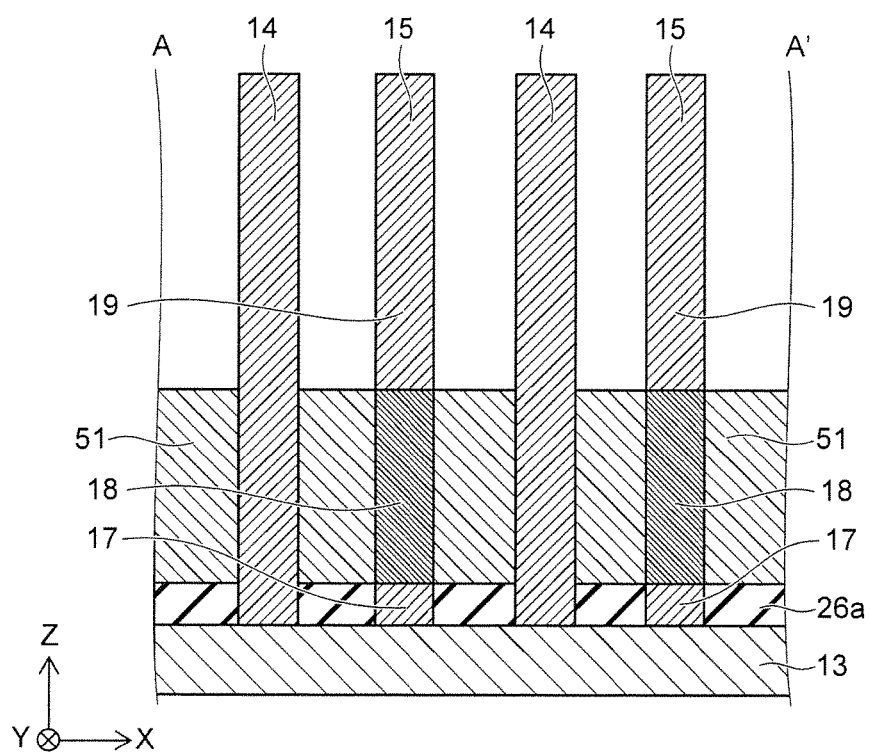

Next, as shown in FIGS. 5A and 5B, a polysilicon film of $n^+$-type conductivity is formed on the interconnect layer made of the global bit lines 13 and the interconnect-to-interconnect insulating films 16. Next, this polysilicon film is divided along the X-direction and the Y-direction to form a plurality of pillar-shaped silicon members 14 and 15. The silicon members 14 and 15 are arranged in a matrix along the X-direction and the Y-direction.

Next, the lower part 26a of the interconnect-to-interconnect insulating film 26 is formed in a lower part of the space between the silicon members by e.g. the CVD method using TEOS as a raw material. Next, the silicon member 15 is locally ion-implanted with impurities serving as an acceptor. Thus, a $p^-$-type portion 18 is formed in the Z-direction middle part of the silicon member 15. At this time, in the silicon member 15, the portion below the $p^-$-type portion 18 constitutes an $n^+$-type portion 17, and the portion above the $p^-$-type portion 18 constitutes an $n^+$-type portion 19. The $n^+$-type portion 17 is surrounded with the lower part 26a of the interconnect-to-interconnect insulating film 26.

Next, a gate insulating film 24 (see FIG. 2) is formed on the side surface of the silicon member 15 by e.g. the LP-CVD method. Next, a conductive film 51 is formed on the interconnect-to-interconnect insulating film 26 in the space between the silicon members by depositing a conductive material such as polysilicon or metal. The conductive film 51 surrounds the $p^-$-type portion 18 of the silicon member 15 via the gate insulating film 24.

Figure 6A:
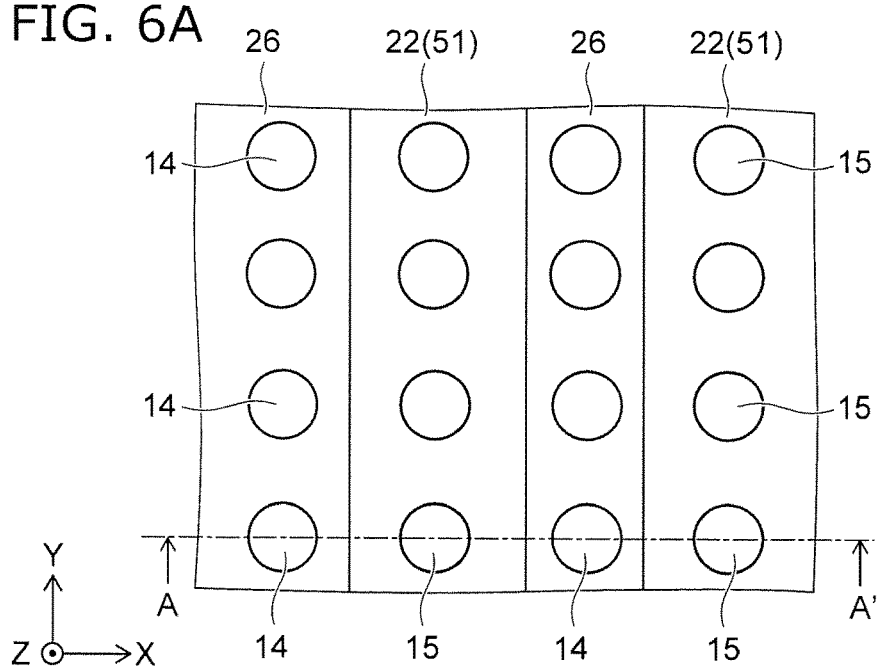
Figure 6B:
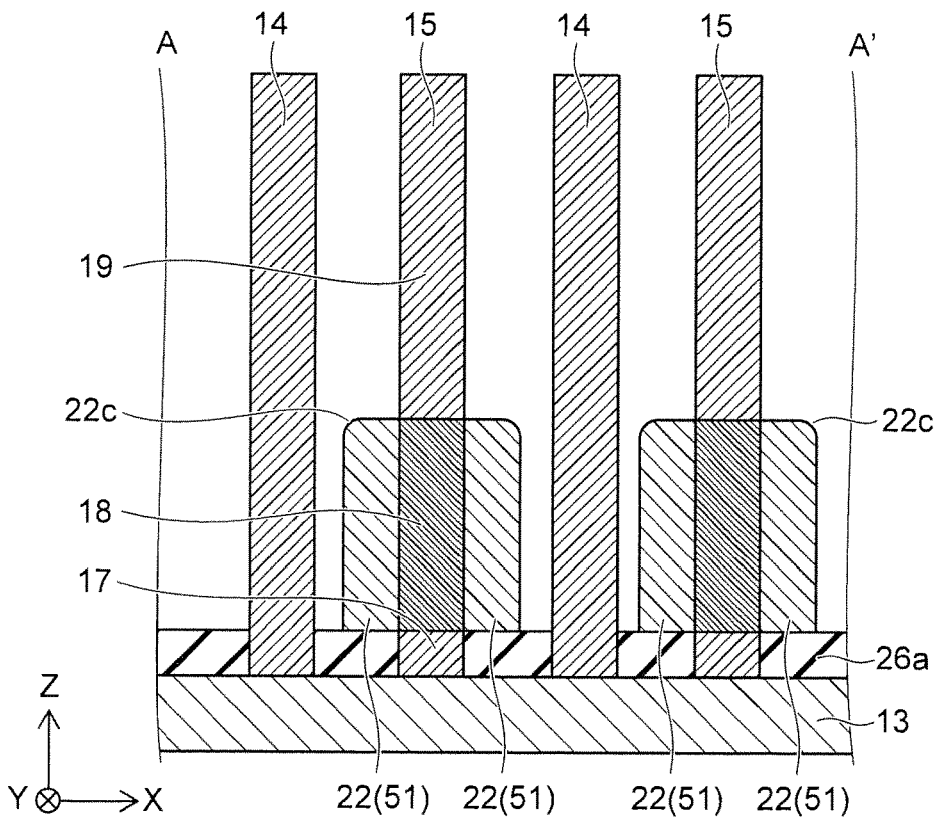

Next, as shown in FIGS. 6A and 6B, a resist mask (not shown) is formed by the lithography method. This resist mask is used as a mask to perform anisotropic etching such as RIE (reactive ion etching). Thus, the conductive film 51 is processed into a line-and-space pattern extending in the Y-direction and divided into a plurality of gate lines 22. This is performed so that the gate line 22 surrounds the silicon member 15 and is spaced from the silicon member 14. This anisotropic etching rounds the corner part 22c between the upper surface and the side surface of the gate line 22.

Figure 7A:
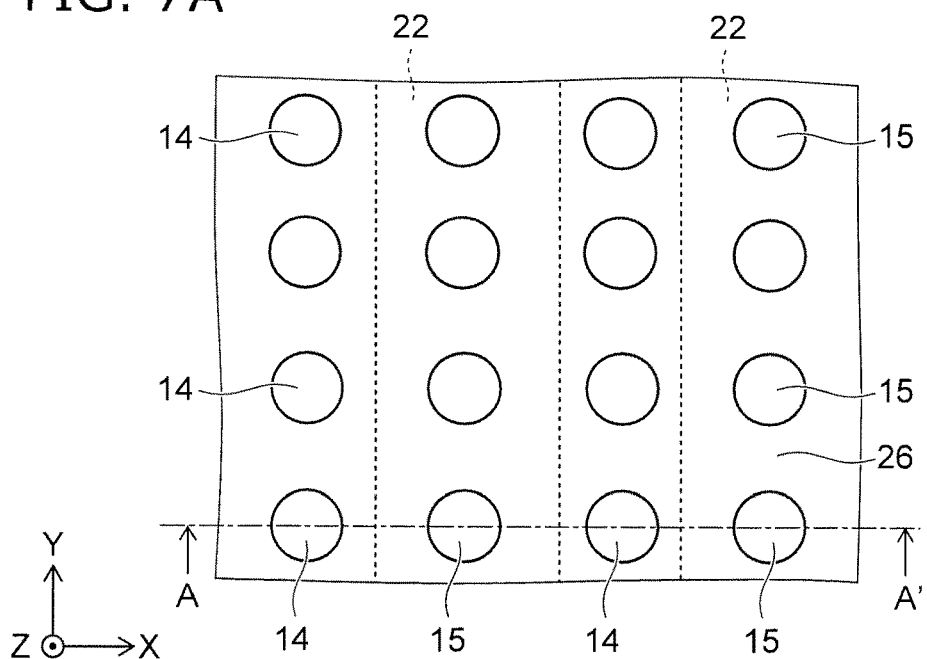
Figure 7B:
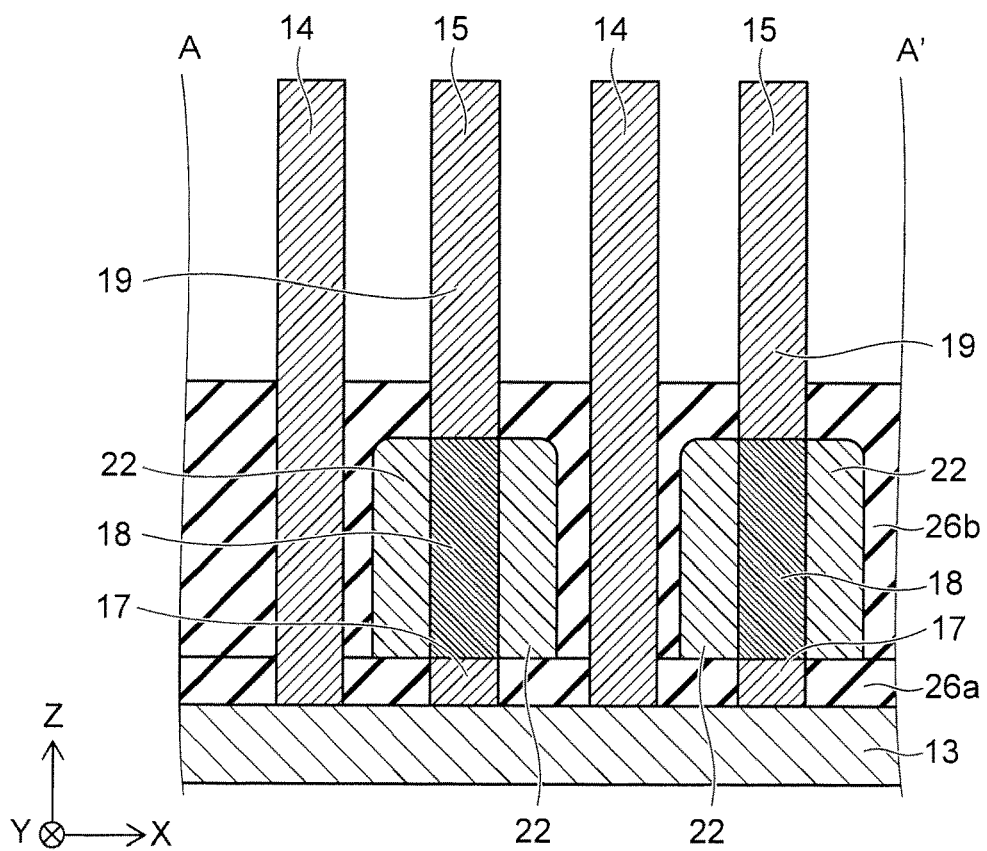

Next, as shown in FIGS. 7A and 7B, silicon oxide is deposited on the entire surface by e.g. the CVD method using TEOS as a raw material, and etched back. Thus, the middle part 26b of the interconnect-to-interconnect insulating film 26 is formed. The middle part 26b of the interconnect-to-interconnect insulating film 26 covers the gate line 22.

Figure 8A:
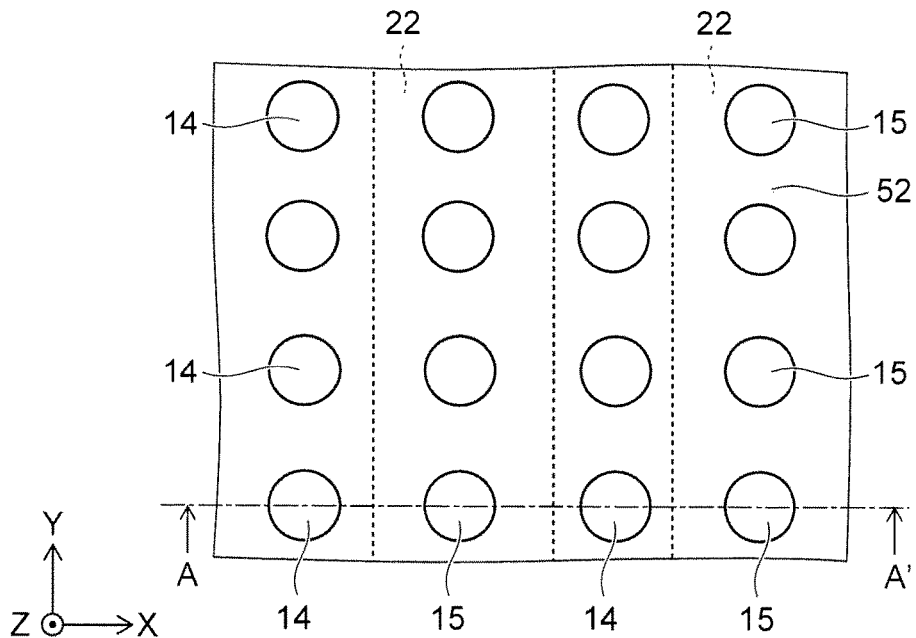
Figure 8B:
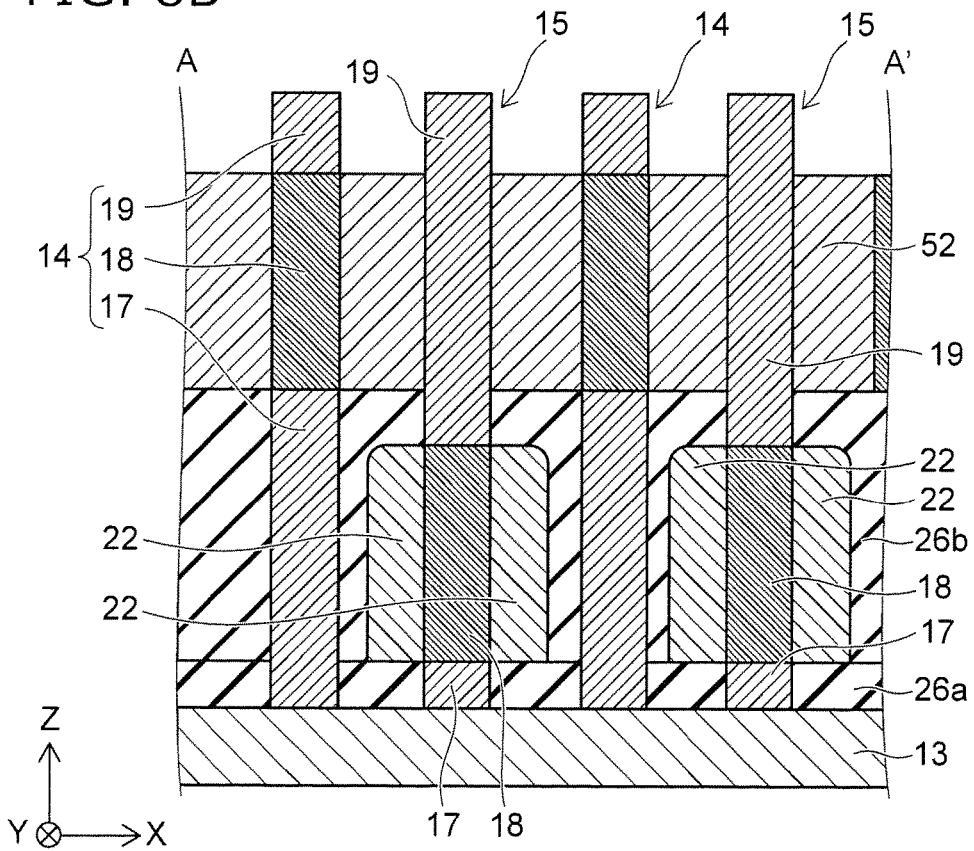

Next, as shown in FIGS. 8A and 8B, the silicon member 14 is locally ion-implanted with impurities serving as an acceptor. Thus, a $p^-$-type portion 18 is formed in the Z-direction middle part of the silicon member 14. At this time, in the silicon member 14, the portion below the $p^-$-type portion 18 constitutes an $n^+$-type portion 17, and the portion above the $p^-$-type portion 18 constitutes an $n^+$-type portion 19. The $n^+$-type portion 17 is surrounded with the middle part 26b of the interconnect-to-interconnect insulating film 26.

Next, a gate insulating film 23 (see FIG. 2) is formed on the side surface of the silicon member 14 by e.g. the LP-CVD method. Next, a conductive film 52 is formed on the middle part 26b of the interconnect-to-interconnect insulating film 26 in the space between the silicon members by depositing a conductive material such as polysilicon or metal. The conductive film 52 surrounds the $p^-$-type portion 18 of the silicon member 14 via the gate insulating film 23.

Figure 9A:
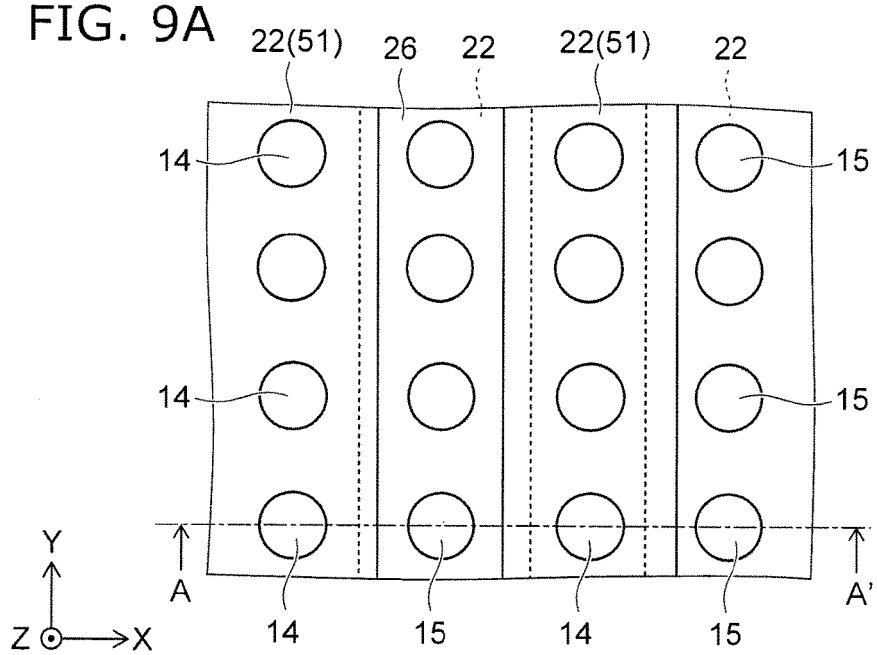
Figure 9B:
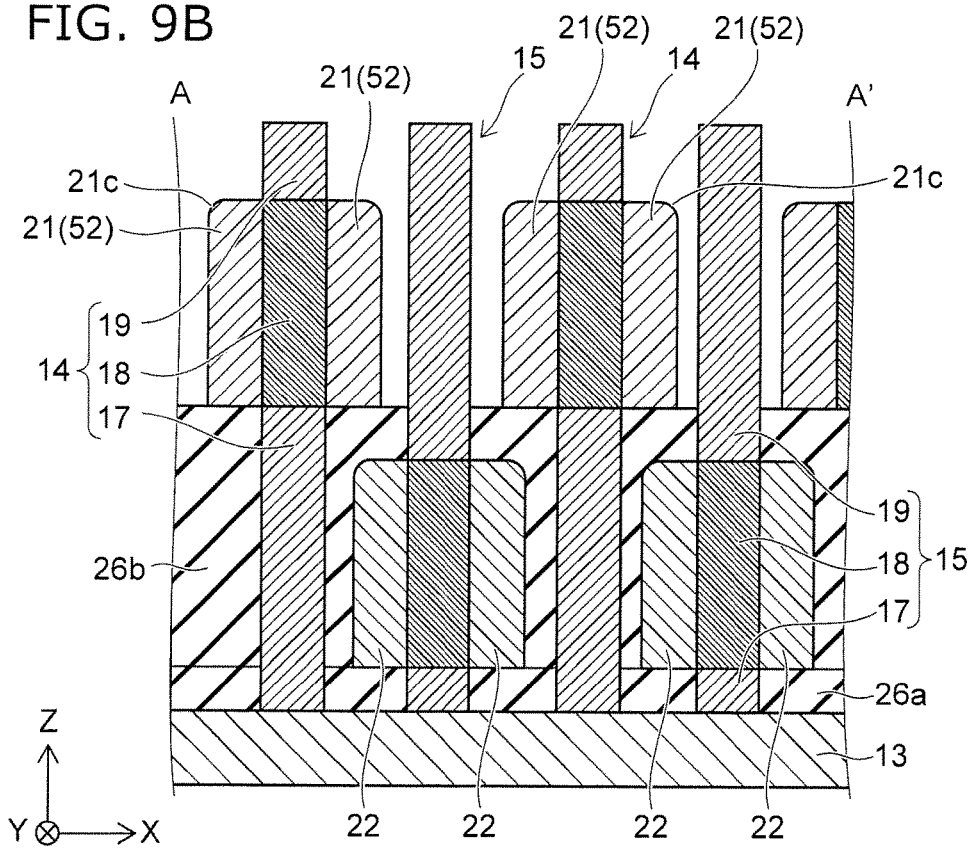

Next, as shown in FIGS. 9A and 9B, a resist mask (not shown) is formed by the lithography method, and anisotropic etching such as RIE is performed. Thus, the conductive film 52 is processed into a line-and-space pattern extending in the Y-direction and divided into a plurality of gate lines 21. This is performed so that the gate line 21 surrounds the silicon member 14 and is spaced from the silicon member 15. This anisotropic etching rounds the corner part 21c between the upper surface and the side surface of the gate line 21.

Figure 10A:
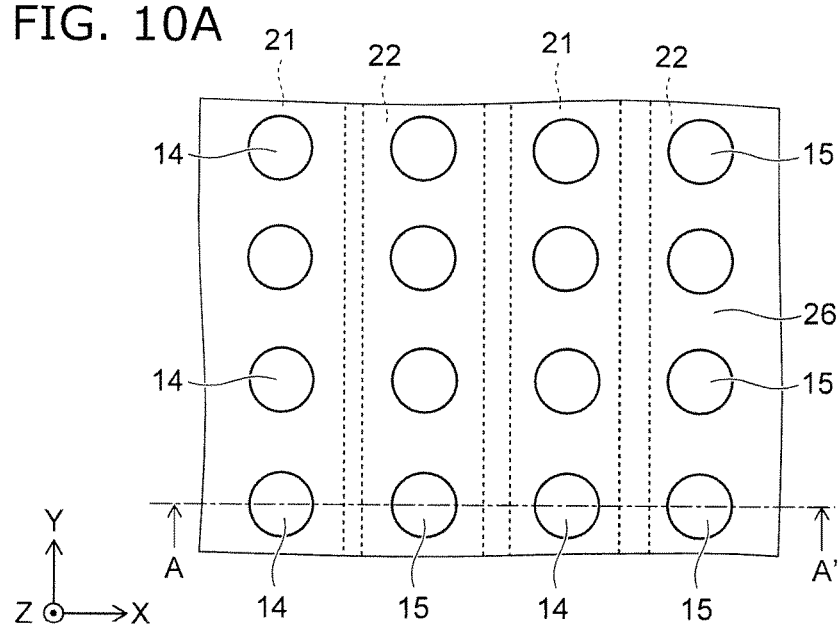
Figure 10B:
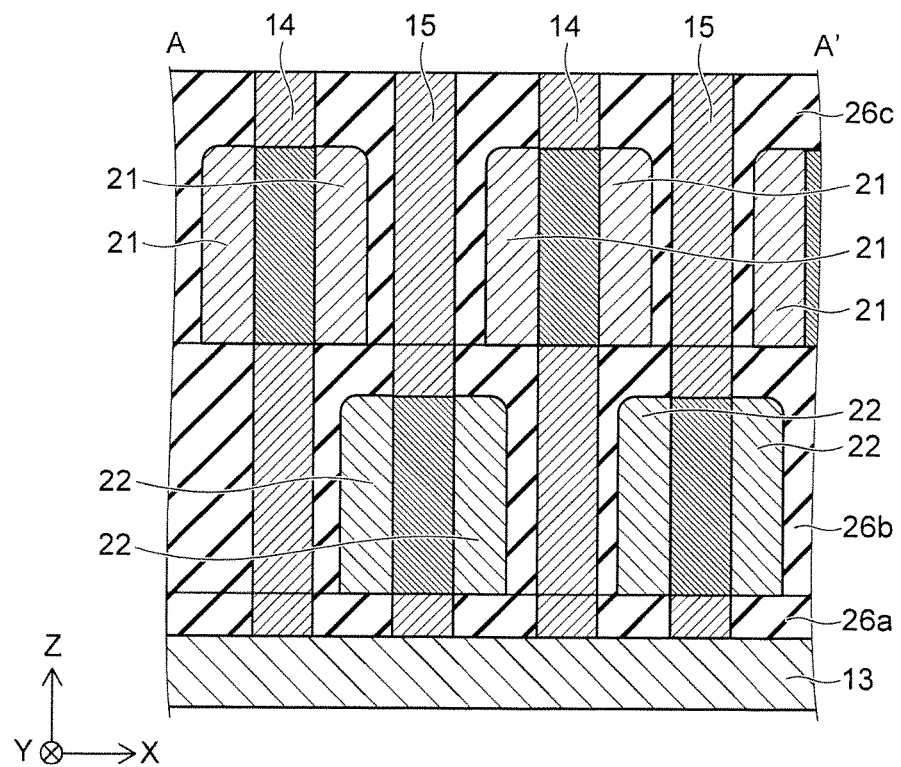

Next, as shown in FIGS. 10A and 10B, silicon oxide is deposited on the entire surface by e.g. the CVD method using TEOS as a raw material, and etched back. Thus, the upper part 26c of the interconnect-to-interconnect insulating film 26 is formed. The lower part 26a, the middle part 26b, and the upper part 26c form an interconnect-to-interconnect insulating film 26. The gate line 21 is covered with the interconnect-to-interconnect insulating film 26. However, the upper surface of the silicon member 14 and the upper surface of the silicon member 15 are exposed at the upper surface of the interconnect-to-interconnect insulating film 26.

Next, as shown in FIGS. 1 to 3, interlayer insulating films 36 and conductive films 53 are alternately formed on the interconnect-to-interconnect insulating film 26 to form a stacked body. Next, a trench extending in the Y-direction is formed in this stacked body. Thus, the conductive film 53 is divided by the trench into word lines 33 extending in the Y-direction. Next, a resistance change film 32 is formed on the inner side surface of the trench. Next, a conductive member 54 is buried in the trench. Next, the conductive member 54 and the resistance change film 32 are divided along the Y-direction. Thus, the conductive member 54 is divided into a plurality of local bit lines 31. Next, an insulating material is buried between the local bit lines 31. Thus, the memory device 1 according to the embodiment is manufactured.

Next, the operation of the memory device according to the embodiment is described.

Figure 11A:
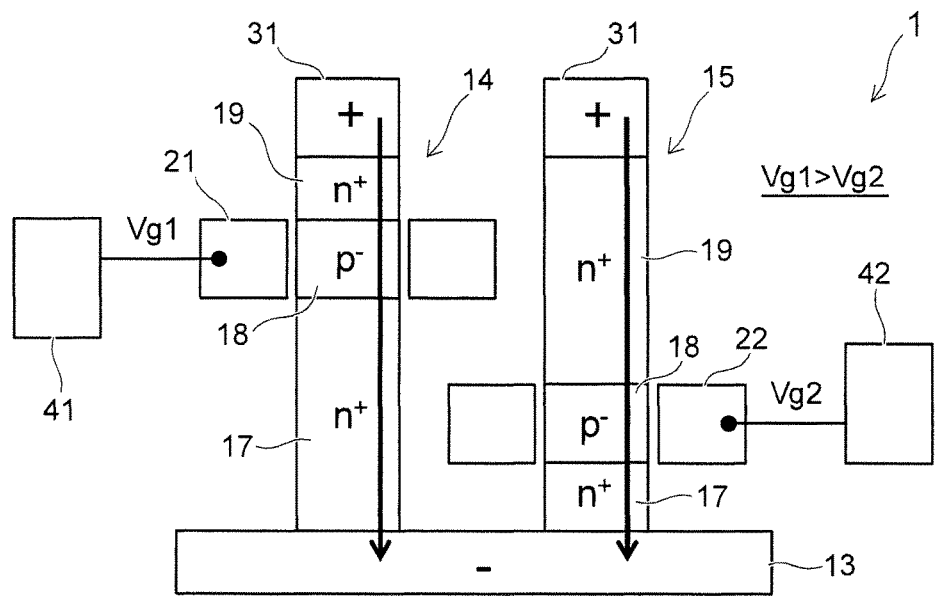
FIGS. 11A and 11B show an operation of the memory device according to the embodiment.
Figure 11B:
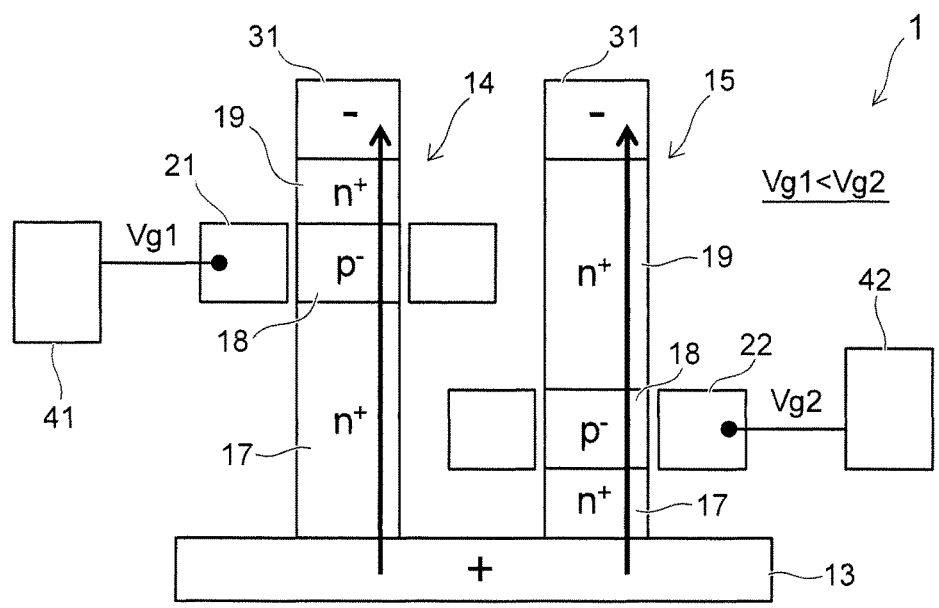

FIGS. 11A and 11B show the operation of the memory device according to the embodiment. FIG. 11A shows the case where the current flows from the local bit line toward the global bit line. FIG. 11B shows the case where the current flows from the global bit line toward the local bit line.

As shown in FIG. 11A, the current may flow in the silicon members 14 and 15 from the local bit line 31 toward the global bit line 13. The TFTs 28 and 29 are of n-channel type. Thus, in this case, the $n^+$-type portion 17 constituting the negative electrode serves as a source, and the $n^+$-type portion 19 constituting the positive electrode serves as a drain. In this case, in the silicon member 14, compared with the silicon member 15, the length in the Z-direction of the $n^+$-type portion 17 is longer. Thus, the source has a higher resistance. Accordingly, the $p^-$-type portion 18 has a higher potential. By that amount, the gate potential for achieving the threshold voltage is higher. Thus, in order to pass the same current in the silicon member 14 as in the silicon member 15, the gate potential Vg1 applied to the gate line 21 by the potential generation circuit 41 is made higher than the gate potential Vg2 applied to the gate line 22 by the potential generation circuit 42. That is, the gate potentials are configured to satisfy Vg1>Vg2.

As shown in FIG. 11B, the current may flow in the silicon members 14 and 15 from the global bit line 13 toward the local bit line 31. In this case, the n⁺-type portion 19 serves as a source. Thus, the gate potential Vg1 applied to the gate line 21 by the potential generation circuit 41 is made lower than the gate potential Vg2 applied to the gate line 22 by the potential generation circuit 42. That is, the gate potentials are configured to satisfy Vg1<Vg2. Thus, the magnitude of the current can be made uniform by making the gate voltage higher in one of the TFT 28 and the TFT 29 having a higher resistance on the source side.

Next, the effect of the embodiment is described.

In the memory device 1 according to the embodiment, the gate lines 21 and the gate lines 22 are placed alternately. The gate line 21 is placed on the upper side of the gate line 22. Thus, the gate line 21 and the gate line 22 can be made thicker in the X-direction while suppressing short circuit and interference between the gate line 21 and the gate line 22. This can reduce the interconnect resistance of the gate lines 21 and 22 and suppress signal delay. In other words, the memory device 1 can be miniaturized by reducing the distance between the silicon member 14 and the silicon member 15 in the X-direction while suppressing the interconnect resistance below a prescribed value.

On the other hand, if the gate line 21 and the gate line 22 are placed at the same height, short circuit or interference is likely to occur between the gate lines when the distance between the silicon members in the X-direction is reduced for miniaturization of the memory device. To avoid this, it is necessary to thin the gate line. However, this increases the interconnect resistance of the gate line and causes signal delay.

Furthermore, in the memory device 1, as viewed in the Z-direction, the side part of the gate line 21 and the side part of the gate line 22 overlap each other. Thus, the gate line 21 and the gate line 22 can be made even thicker, and the resistance can be suppressed more effectively.

Furthermore, in the memory device 1, the corner part 22c between the upper surface and the side surface of the lower gate line 22 is rounded. Thus, concentration of electric field is relieved in the corner part 22c. This can improve the breakdown voltage between the gate line 22 and the gate line 21. Furthermore, the corner part 21c between the upper surface and the side surface of the upper gate line 21 is rounded. Thus, concentration of electric field is relieved in the corner part 21c. This can improve the breakdown voltage between the gate line 21 and the silicon member 15 and between the local bit line 31 and the lowermost word line 33.

Furthermore, in the memory device 1, the control circuit 40 can apply mutually different potentials to the gate line 21 and the gate line 22. Thus, the magnitude of the current flowing in the silicon member 14 and the magnitude of the current flowing in the silicon member 15 can be made uniform. This enables accurate operation in the memory device 1 and further miniaturization of the memory device 1.

The embodiments described above can realize a memory device having a high memory density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first interconnect extending in a first direction;
a first semiconductor member and a second semiconductor member arranged along the first direction and extending in a second direction crossing the first direction, with first ends in the second direction connected to the first interconnect;
a first gate line extending in a third direction crossing a plane including the first direction and the second direction;
a second gate line extending in the third direction;
a second interconnect connected to a second end in the second direction of the first semiconductor member and extending in the second direction;
a third interconnect connected to a second end in the second direction of the second semiconductor member and extending in the second direction;
a fourth interconnect; and
a first resistance change film connected between the second interconnect and the fourth interconnect,
distance between the first semiconductor member and the first gate line being shorter than distance between the first semiconductor member and the second gate line,
distance between the second semiconductor member and the second gate line being shorter than distance between the second semiconductor member and the first gate line,
distance between the first interconnect and the first gate line being longer than distance between the first interconnect and the second gate line, and
no conductive member or semiconductor member being interposed on a straight line extending in the second direction and connecting between an edge on the first semiconductor member side of the first gate line and the first interconnect.

2. The device according to claim 1, wherein
no conductive member or semiconductor member is placed between the first semiconductor member and the second gate line adjacent to each other, and
no conductive member or semiconductor member is placed between the second semiconductor member and the first gate line adjacent to each other.

3. The device according to claim 1, further comprising:
a first gate insulating film provided between the first semiconductor member and the first gate line; and
an interconnect-to-interconnect insulating film provided between the first semiconductor member and the second gate line,
wherein density of the first gate insulating film is higher than density of the interconnect-to-interconnect insulating film.

4. The device according to claim 3, further comprising:
a second gate insulating film provided between the second semiconductor member and the second gate line, wherein density of the second gate insulating film is higher than the density of the interconnect-to-interconnect insulating film.

5. The device according to claim 1, wherein as viewed in the second direction, a part of the first gate line and a part of the second gate line overlap each other.

6. The device according to claim 1, wherein as viewed in the second direction, the first gate line surrounds the first semiconductor member, and the second gate line surrounds the second semiconductor member.

7. The device according to claim 1, wherein
a first portion including the first end and a second portion including the second end in the first semiconductor member are of a first conductivity type, and
a third portion between the first portion and the second portion in the first semiconductor member is of a second conductivity type.

8. The device according to claim 7, wherein the first gate line surrounds the third portion.

9. The device according to claim 1, wherein the fourth interconnect extends in the third direction.

10. The device according to claim 1, further comprising:
a second resistance change film connected between the third interconnect and the fourth interconnect.

11. The device according to claim 1, wherein curvature of a corner part between an upper surface and a side surface of the second gate line is smaller than curvature of a corner part between a lower surface and the side surface of the second gate line.

12. The device according to claim 1, further comprising:
a control circuit,
wherein the control circuit includes:
a first circuit configured to apply a first potential to the first gate line; and
a second circuit configured to apply a second potential to the second gate line,
the first potential causes a transistor formed between the first semiconductor member and the first gate line to conduct, and
the second potential causes a transistor formed between the second semiconductor member and the second gate line to conduct.

13. The device according to claim 12, wherein
a conductivity type of a first portion including the first end and a conductivity type of a second portion including the second end in the first semiconductor member are an n-type, and
a conductivity type of a third portion between the first portion and the second portion in the first semiconductor member is a p-type.

14. The device according to claim 13, wherein the control circuit makes the first potential higher than the second potential when passing a current from the second interconnect toward the first interconnect and passing a current from the third interconnect toward the first interconnect.

* * * * *